(12) United States Patent
Huang et al.

(10) Patent No.: US 11,044,833 B2
(45) Date of Patent: Jun. 22, 2021

(54) WATER-COOLED PRESSURIZED DISTRIBUTIVE HEAT DISSIPATION SYSTEM FOR RACK

(71) Applicant: TAIWAN MICROLOOPS CORP., New Taipei (TW)

(72) Inventors: Yen-Chia Huang, New Taipei (TW); Chun-Hung Lin, New Taipei (TW)

(73) Assignee: TAIWAN MICROLOOPS CORP., New Taipei (TW)

(*) Notice: Subject to any disclaimer, the term of this patent is extended or adjusted under 35 U.S.C. 154(b) by 0 days.

(21) Appl. No.: 16/655,114

(22) Filed: Oct. 16, 2019

(65) Prior Publication Data

US 2020/0253090 A1 Aug. 6, 2020

(30) Foreign Application Priority Data

Feb. 1, 2019 (TW) .................................. 108104274

(51) Int. Cl.
*H05K 7/20* (2006.01)
(52) U.S. Cl.
CPC ................................ *H05K 7/20781* (2013.01)
(58) Field of Classification Search
CPC ........... H05K 7/20781; H05K 7/20981; H05K 7/20636; H05K 7/20645; H05K 7/20272; H05K 7/20254; H05K 7/20281
See application file for complete search history.

(56) References Cited

U.S. PATENT DOCUMENTS

| 7,318,322 | B2 * | 1/2008 | Ota | H05K 7/20781 |
| | | | | 62/259.2 |
| 7,599,184 | B2 * | 10/2009 | Upadhya | H05K 7/20727 |
| | | | | 165/104.33 |
| 9,769,954 | B2 * | 9/2017 | Bonnin | H05K 7/20781 |
| 9,883,616 | B2 * | 1/2018 | Chainer | H05K 7/20272 |
| 10,201,116 | B1 * | 2/2019 | Ross | H05K 7/2079 |
| 2011/0240281 | A1 * | 10/2011 | Avery | H05K 7/20836 |
| | | | | 165/287 |
| 2014/0060799 | A1 * | 3/2014 | Eckberg | G05D 23/1932 |
| | | | | 165/287 |
| 2019/0320548 | A1 * | 10/2019 | Gao | H05K 7/20781 |

FOREIGN PATENT DOCUMENTS

| TW | M346849 U | 12/2008 |
| TW | 201414924 A | 4/2014 |

OTHER PUBLICATIONS

Office Action dated Jul. 17, 2019 of the corresponding Taiwan patent application.

* cited by examiner

*Primary Examiner* — Mukundbhai G Patel
(74) *Attorney, Agent, or Firm* — Chun-Ming Shih; HDLS IPR Services

(57) ABSTRACT

A water-cooled pressurized distributive heat dissipation system used for dissipating heat of servers in the rack is provided. The servers are fixed in the rack in a ranging direction. The system includes a water tank having a distributing duct, branch modules separately corresponding to the servers and a converging duct. Each branch module has a branch pump and a water block in a corresponding one of the servers. The branch pump of each branch module connects between the distributing duct and the water block. The converging duct connects to the water blocks in the ranging direction.

10 Claims, 5 Drawing Sheets

WATER-COOLED PRESSURIZED DISTRIBUTIVE HEAT DISSIPATION SYSTEM FOR RACK

BACKGROUND OF THE INVENTION

Technical Field

The invention relates to heat dissipation systems for servers, particularly to a water-cooled pressurized distributive heat dissipation system for a rack.

Related Art

A conventional water-cooled heat dissipation system applied in a rack for servers uses a master pump to drive working fluid to separately flow into water blocks on corresponding heat sources of servers by flow distribution. Although a water-cooling effect can be accomplished, flow of the working fluid tends to be affected because of different lengths of pipelines. For example, the longer the length of a pipeline is, the lower the flow of the working fluid is.

However, unavoidably, servers mounted in a rack are usually arranged in a vertical or superpositional direction, so a distance between the top one and the bottom one is the longest than others. Thus, these two servers with the longest distance, which are connected by the abovementioned pipeline, must only obtain less flow of the working fluid than others. This causes an uneven effect of heat dissipation or cooling. If a larger pump is used to satisfy the lowest effect of heat dissipation or cooling, then the costs will be increased. This is a problem to be solved.

SUMMARY OF THE INVENTION

An object of the invention is to provide a water-cooled pressurized distributive heat dissipation system for a rack, which uses a flow distribution approach to implement an effect of even flow.

Another object of the invention is to provide a water-cooled pressurized distributive heat dissipation system for a rack, which can use pumps with less power because of flow distribution.

To accomplish the above objects, the invention provides a water-cooled pressurized distributive heat dissipation system, which is used for dissipating heat of servers in the rack, wherein the servers are fixed in the rack in a ranging direction. The system includes a water tank having a distributing duct, branch modules separately corresponding to the servers and a converging duct. Each branch module has a branch pump and a water block in a corresponding one of the servers. The branch pump of each branch module connects between the distributing duct and the water block. The converging duct connects to the water blocks in the ranging direction.

To accomplish the above objects, the invention provides a water-cooled pressurized distributive heat dissipation system further including another distributing duct, another converging duct and branch modules connected between the another distributing duct and the another distributing duct, wherein the converging duct connects to the another distributing duct.

DETAILED DESCRIPTION OF THE INVENTION

Figure 1:
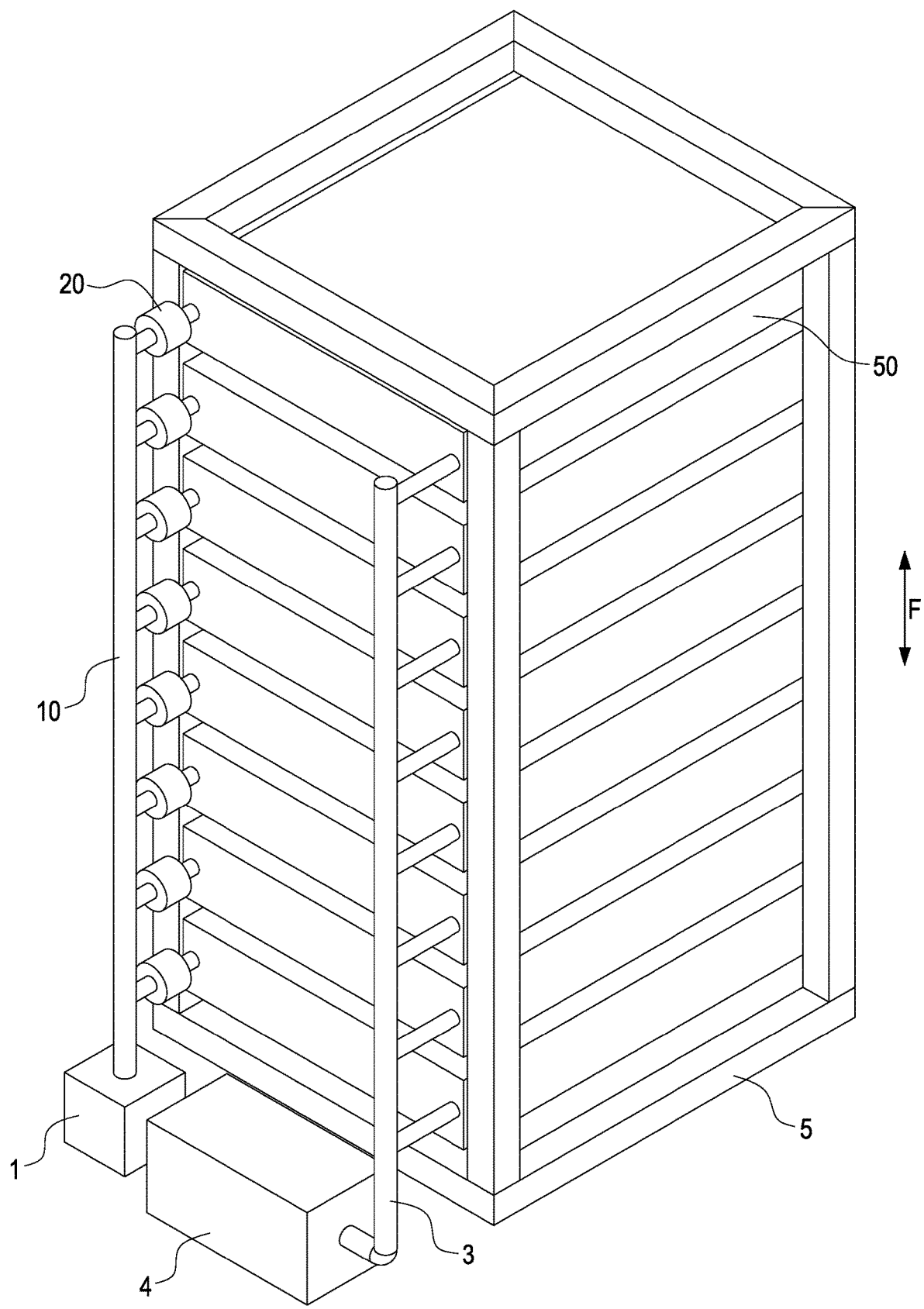
FIG. 1 is a schematic view of the invention applied to a rack.
Figure 2:
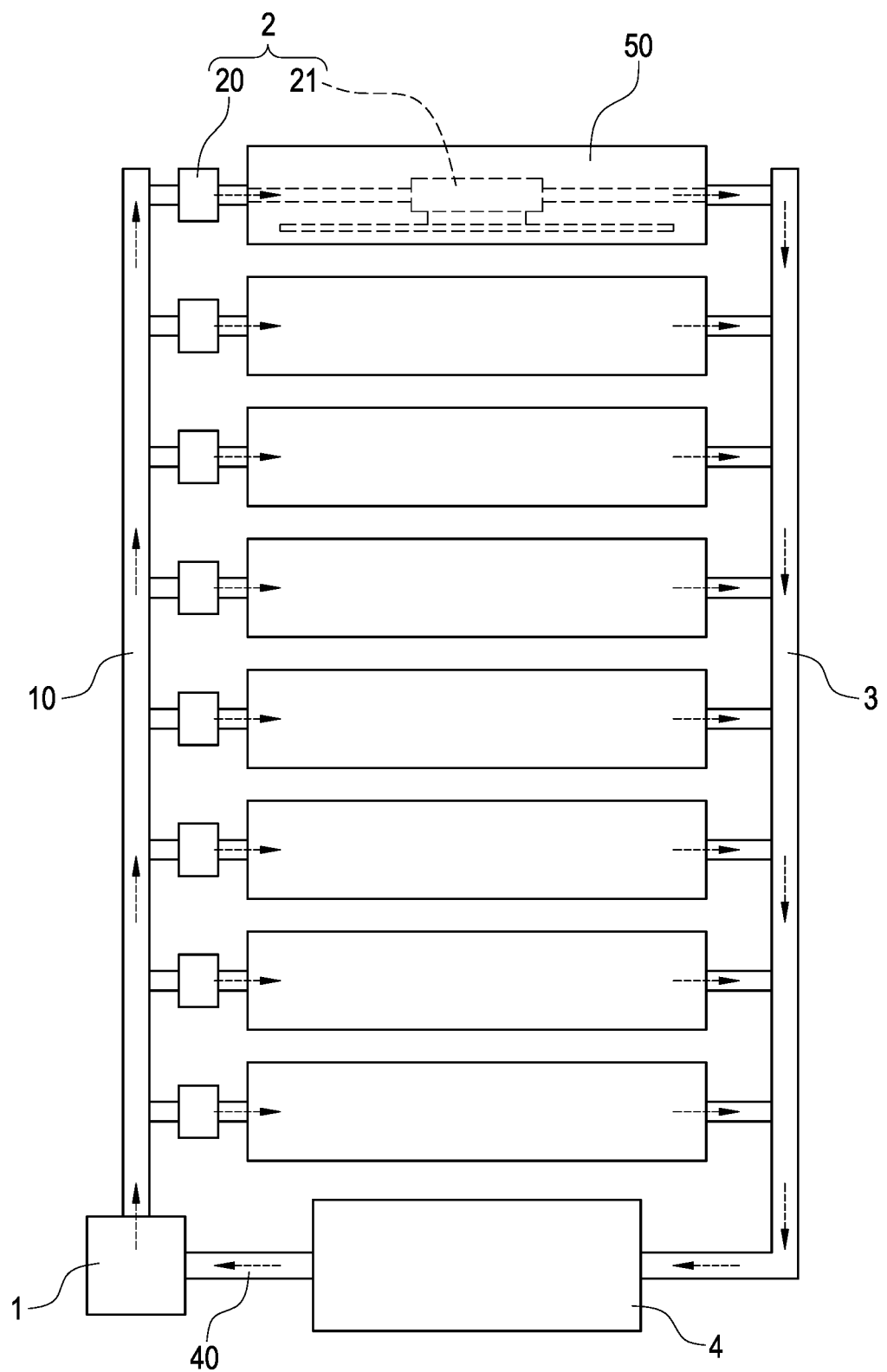
FIG. 2 is a schematic plan view of the first embodiment of the invention.

Please refer to FIGS. 1 and 2, which are a schematic view of the invention applied to a rack and a schematic plan view of the first embodiment of the invention, respectively. The invention provides a water-cooled pressurized distributive heat dissipation system for a rack, which is used for dissipating heat of servers 50 in the rack 5, wherein the servers 50 are fixed in the rack 5 in a ranging direction F. Usually, the ranging direction is a vertical or superpositional direction. The water-cooled heat dissipation system includes a water tank 1, branch modules 2 and a converging duct 3.

The water tank 1 may be disposed outside the rack 1 and holds a working fluid for heat dissipation or cooling, such as water. A distributing duct 10 is connected to the water tank 1. The working fluid in the water tank 1 can be conveyed into the servers 50 in the rack 50 for dissipating heat from heat sources in the servers 50.

The branch modules 2 separately correspond to the servers, each of which has a branch pump 20 and at least one water block 21 in a corresponding one of the servers 50. The branch pump 20 of each branch module 2 connects between the distributing duct 10 and the water block 21. As shown in FIG. 2, in this embodiment, each server 50 is correspondingly disposed with at least one water block 21. After the water block 21 is connected with the branch pump 20, the working fluid can be conveyed from the water tank 1 to the water blocks 21 through the distributing duct 10 to dissipate heat from heat sources in the servers 50.

The converging duct 3 is disposed outside the servers 50 and connects to the water blocks 21 of the branch modules 2 in the ranging direction F. As a result, each branch module 2 has a branch pump 20 corresponding to one of the servers 50 in the rack 5. The working fluid can be evenly conveyed to each of the water blocks 21 and then converged in the converging duct 3 arranged in the ranging direction F. Accordingly, both flow and speed of the working fluid are stable and even and the effect of heat dissipation is great.

In addition, the invention may be further provided with a cooling device 4 between the water tank 1 and an output end of the converging duct 3 to cool the working fluid in the converging duct 3. A connecting pipe 40 is connected between the water tank 40 and the cooling device 4 to form a circulating pipeline so as to make the working fluid circulate in the circulating pipeline.

Figure 3:
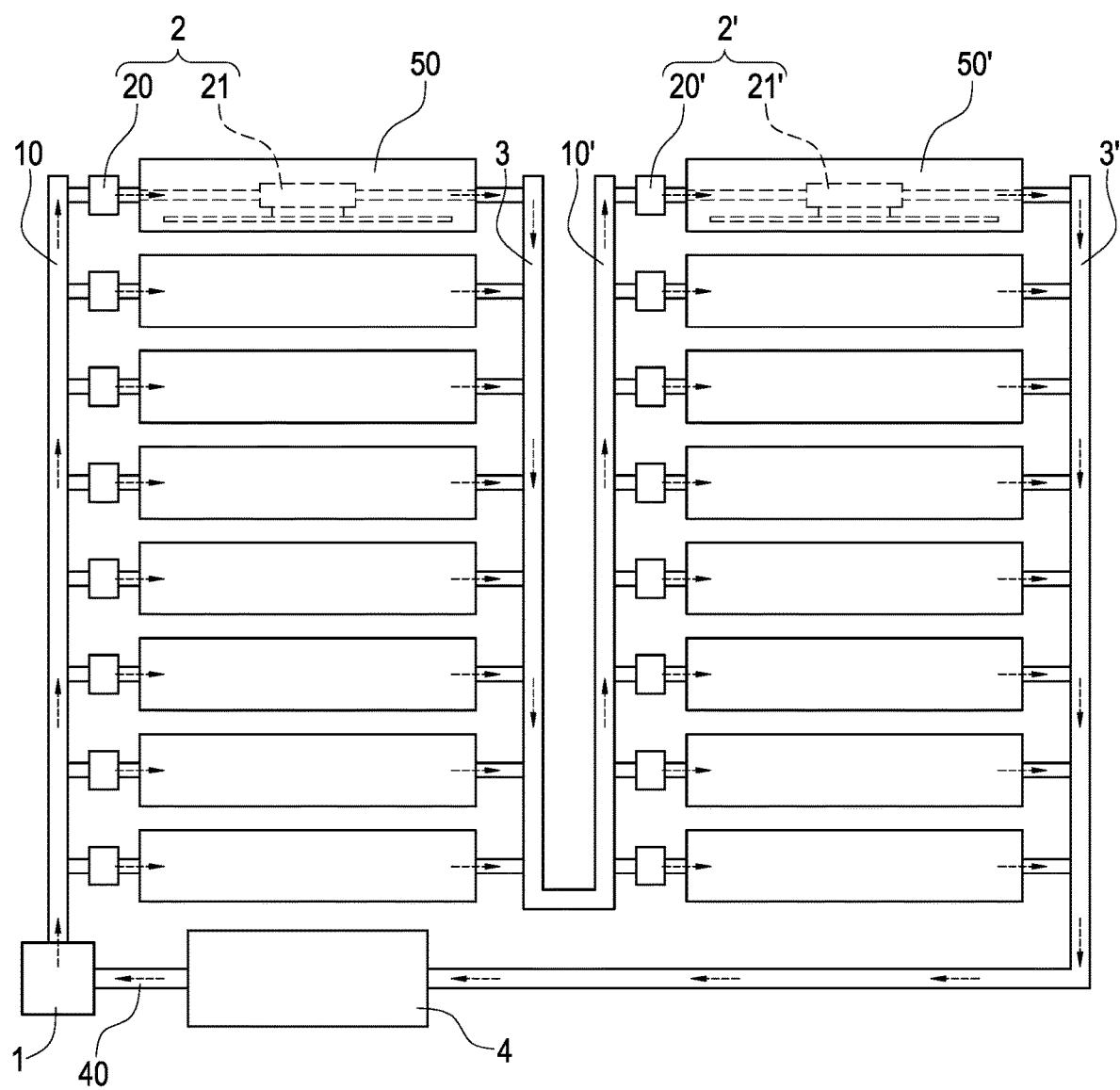
FIG. 3 is a schematic plan view of the second embodiment of the invention.

FIG. 3 is a schematic plan view of the second embodiment of the invention. The invention can connect servers 50, 50' in two racks 5 to form a circulating cooling pipeline. The converging duct 3 of the first rack 1 is connected to another distributing duct 10' of the second rack 5'. The distributing duct 10' further provides branch modules 20' for cooling additional servers 5. Identically, each of the branch modules 20' has a branch pump 20' and at least one water block 21' in a corresponding one of the servers 50'. A converging duct 3' is connect to the water blocks 21' of the branch modules 2'. The working fluid is converged to the cooling device 4 to make circulation through the circulating pipeline.

Figure 4:
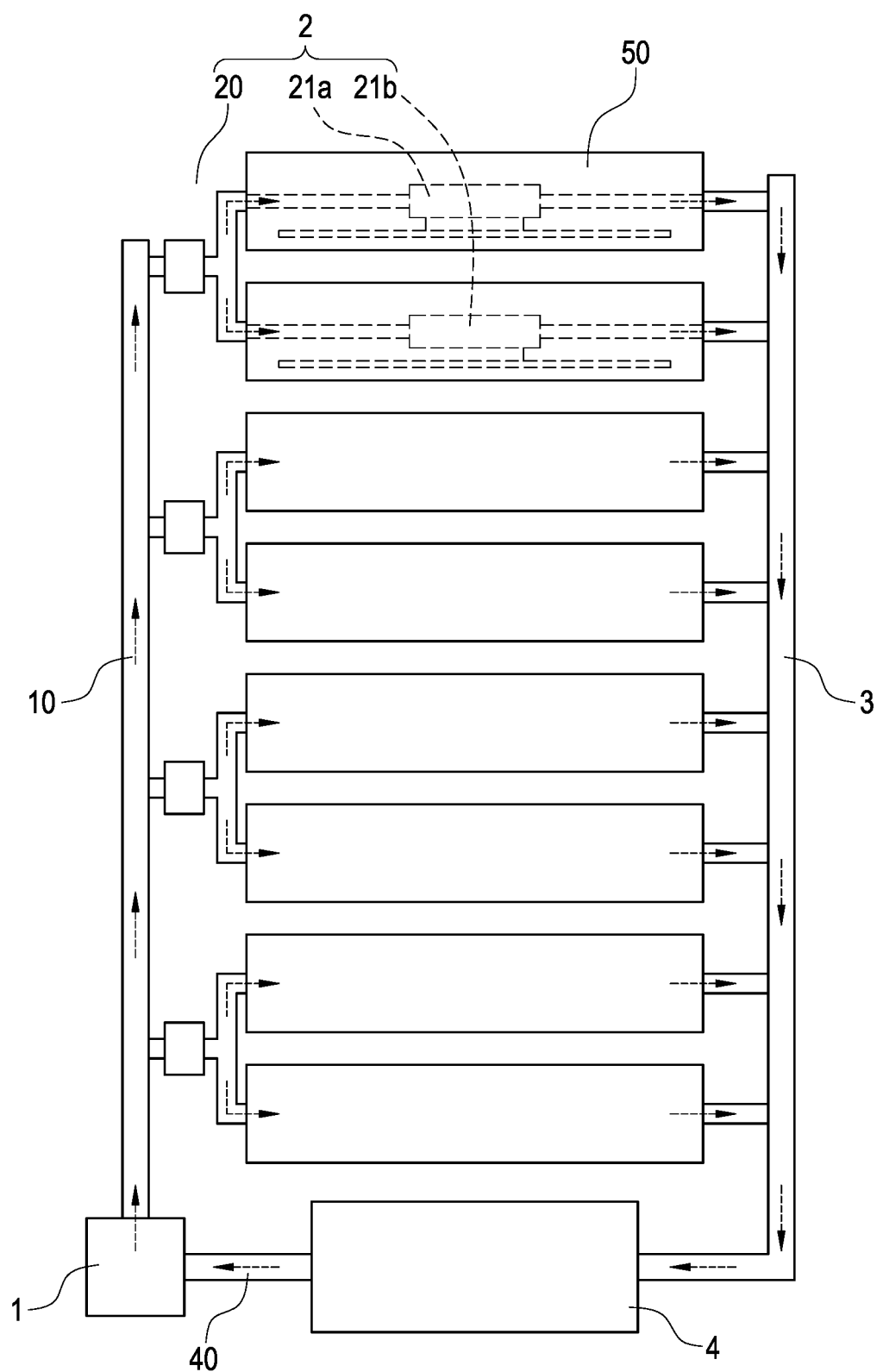
FIG. 4 is a schematic plan view of the third embodiment of the invention.

FIG. 4 is a schematic plan view of the third embodiment of the invention. The branch pump 20 of each branch module 2 of the invention may correspond to a plurality of heat sources or servers 50. For example, the branch pump 20 of each branch module 2 is split to connect with water blocks 21a, 21b. Each branch pump 20 corresponds to two servers 50 and each water block 21a, 21b is disposed in a server 50. As a result, under a condition of not affecting both flow and speed of the working fluid, a single branch module 2 may have more than one water block 21 and a single branch pump 20 may have more than one water block 21. That is, the branch pump 20 of each branch module 2 can correspond to multiple water blocks 21a, 21b so as to make the water blocks 21a, 21b correspond to multiple servers 50.

Figure 5:
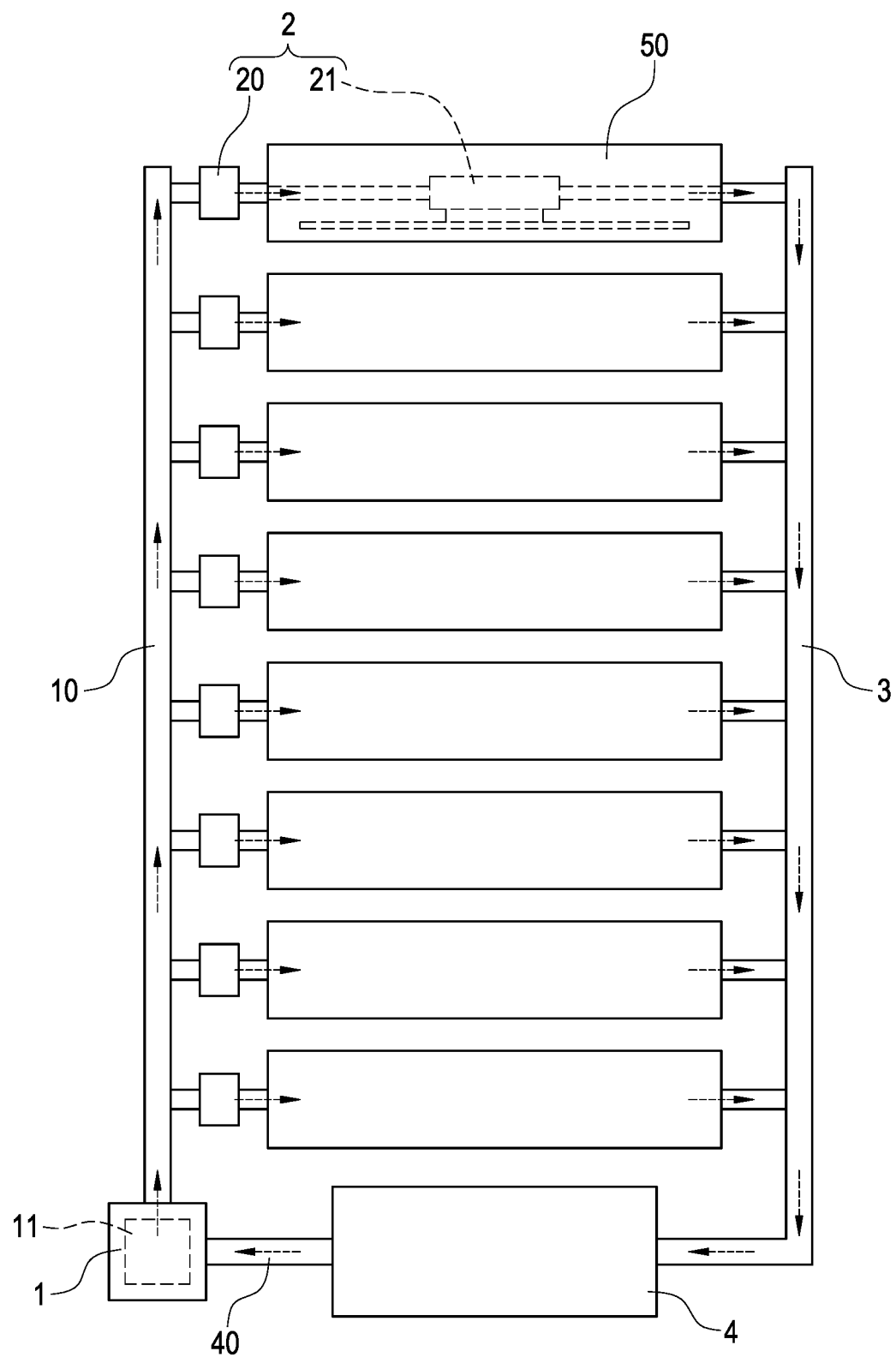
FIG. 5 is a schematic plan view of the fourth embodiment of the invention.

FIG. 5 is a schematic plan view of the fourth embodiment of the invention. The invention may be further provided with a main pump 11 to drive the working fluid to make circulation through the distributing duct 10 and the converging duct 3 for dissipating heat of the servers 50 in the rack 5.

It will be appreciated by persons skilled in the art that the above embodiments have been described by way of example only and not in any limitative sense, and that various alterations and modifications are possible without departure from the scope of the disclosed example as defined by the appended claims.

What is claimed is:

1. A water-cooled pressurized distributive heat dissipation system for a rack, which is used for dissipating heat of servers in the rack, wherein the servers are fixed in the rack in a ranging direction, comprising:

a water tank having a distributing duct;

branch modules, separately corresponding to the servers, each having a branch pump and at least one water block in a corresponding one of the servers, and the branch pump of each branch module is located between the distributing duct and the servers;

a converging duct connecting to the water blocks in the ranging direction; and a main pump driving a working fluid in the water tank to flow toward the distributing duct, wherein the water block of each branch module is multiple in number, and a first water and a second water block are connected with a same branch pump, the first water block is disposed in a first server and the second water block is disposed in a second server.

2. The water-cooled pressurized distributive heat dissipation system of claim 1, further comprising a cooling device disposed between the water tank and an output end of the converging duct.

3. The water-cooled pressurized distributive heat dissipation system of claim 2, wherein a connecting pipe is connected between the water tank and the cooling device.

4. The water-cooled pressurized distributive heat dissipation system of claim 1, wherein the branch pump of each branch module is split to connect with the water blocks.

5. The water-cooled pressurized distributive heat dissipation system of claim 1, further comprising another distributing duct, another converging duct and branch modules connected between the another distributing duct and the another distributing duct, wherein the converging duct connects to the another distributing duct.

6. The water-cooled pressurized distributive heat dissipation system of claim 5, further comprising a cooling device disposed between the water tank and an output end of the converging duct.

7. The water-cooled pressurized distributive heat dissipation system of claim 6, wherein a connecting pipe is connected between the water tank and the cooling device.

8. The water-cooled pressurized distributive heat dissipation system of claim 5, wherein the water block of each branch module is multiple in number.

9. The water-cooled pressurized distributive heat dissipation system of claim 8, wherein the branch pump of each branch module is split to connect with the water blocks.

10. The water-cooled pressurized distributive heat dissipation system of claim 1, wherein the branch pump is disposed outside the rack.

* * * * *